(12) United States Patent
Scott et al.

(10) Patent No.: US 12,368,418 B2
(45) Date of Patent: Jul. 22, 2025

(54) POWER AMPLIFIER USING MULTI-PATH COMMON-MODE FEEDBACK LOOP

(71) Applicant: Qorvo US, Inc., Greensboro, NC (US)

(72) Inventors: Baker Scott, San Jose, CA (US); George Maxim, Saratoga, CA (US); Stephen James Franck, Felton, CA (US)

(73) Assignee: Qorvo US, Inc., Greensboro, NC (US)

( * ) Notice: Subject to any disclaimer, the term of this patent is extended or adjusted under 35 U.S.C. 154(b) by 826 days.

(21) Appl. No.: 17/588,799

(22) Filed: Jan. 31, 2022

(65) Prior Publication Data

US 2023/0246610 A1    Aug. 3, 2023

(51) Int. Cl.
*H03F 3/24*    (2006.01)
(52) U.S. Cl.
CPC ....... *H03F 3/245* (2013.01); *H03F 2200/171* (2013.01); *H03F 2200/451* (2013.01)
(58) Field of Classification Search
CPC ... H03F 3/245; H03F 1/34; H03F 3/20; H03F 3/265; H03F 2200/18
USPC ................................. 330/296, 77, 81, 102
See application file for complete search history.

(56) References Cited

U.S. PATENT DOCUMENTS

| | | | | |
|---|---|---|---|---|
| 3,898,576 A | * | 8/1975 | Fukaya | .......... H03F 1/34 330/253 |
| RE29,273 E | * | 6/1977 | Reiffin | .......... H03F 3/3091 330/274 |
| 4,833,423 A | * | 5/1989 | Molloy | .......... H03F 1/307 330/265 |
| 6,268,770 B1 | * | 7/2001 | Barbetta | .......... H03F 3/3018 330/264 |
| 2008/0212818 A1 | * | 9/2008 | DelPapa | .......... H04R 3/00 381/345 |

(Continued)

FOREIGN PATENT DOCUMENTS

WO    2021232030 A1    11/2021

OTHER PUBLICATIONS

Zhang, X. et al., "A 0.1-4GHz SDR receiver with reconfigurable 10-100 MHz signal bandwidth in 65 nm CMOS," Analog Integrated Circuits and Signal Processing, vol. 77, Oct. 2013, Springer, pp. 567-582.

(Continued)

*Primary Examiner* — Patricia T Nguyen
(74) *Attorney, Agent, or Firm* — Withrow & Terranova, P.L.L.C.

(57) ABSTRACT

A power amplifier using multi-path common-mode feedback loops for radio frequency linearization is disclosed. In one aspect, a complementary metal oxide semiconductor (CMOS) power amplifier containing cascoded n-type field effect transistors (NFETs) and cascoded p-type FETs (PFETs) may have a common-mode feedback network and provides bias voltages that are dynamically varying with the signal power to keep the output common-mode fixed around a half-supply level, while the small-signal and large-signal transconductances of the FET's are kept balanced. A further feedback network may be associated with the supply voltage to assist in providing a symmetrical supply signal. The symmetrical supply signal allows for supply variations without introducing distortion for the power amplifier stage.

17 Claims, 18 Drawing Sheets

(56) References Cited

U.S. PATENT DOCUMENTS

| | | | |
|---|---|---|---|
| 2008/0290911 A1* | 11/2008 | Williams | H03K 17/18 |
| | | | 327/109 |
| 2014/0159683 A1 | 6/2014 | Pan et al. | |
| 2014/0266444 A1* | 9/2014 | Scott | H03F 3/21 |
| | | | 330/257 |
| 2016/0134238 A1* | 5/2016 | Ho | H03F 3/45183 |
| | | | 330/273 |
| 2020/0244258 A1* | 7/2020 | Bazzani | H03F 3/72 |
| 2020/0266771 A1* | 8/2020 | Britz | H02M 3/158 |

OTHER PUBLICATIONS

Partial European Search Report for European Patent Application No. 23154128.5, mailed Jun. 29, 2023, 18 pages.
Extended European Search Report for European Patent Application No. 23154128.5, mailed Oct. 27, 2023, 20 pages.

\* cited by examiner

POWER AMPLIFIER USING MULTI-PATH COMMON-MODE FEEDBACK LOOP

BACKGROUND

I. Field of the Disclosure

The technology of the disclosure relates generally to power amplifiers and more particularly, to complementary metal oxide semiconductor (CMOS) power amplifiers with a feedback loop.

II. Background

Computing devices abound in modern society, and more particularly, mobile communication devices have become increasingly common. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences. Almost all mobile communication devices rely on power amplifiers in at least the transmission chains. While there are myriad ways in which power amplifiers may be formed, the advent of the Fifth Generation-New Radio (5G-NR) cellular standard has placed additional pressure on finding efficient power amplifiers that operate linearly at the frequencies of interest for 5G-NR.

SUMMARY

Aspects disclosed in the detailed description include a power amplifier using multi-path common-mode feedback loops for radio frequency linearization. In particular, a complementary metal oxide semiconductor (CMOS) power amplifier containing cascoded n-type field effect transistors (FETs) (NFETs) and cascoded p-type FETs (PFETs) may have a common-mode feedback network and provides bias voltages that are dynamically varying with the signal power to keep the output common-mode fixed around a half-supply level, while the small-signal and large-signal transconductances of the FETs are kept balanced. A further feedback network may be associated with the supply voltage to assist in providing a symmetrical supply signal. The symmetrical supply signal allows for supply variations without introducing distortion for the power amplifier stage. This arrangement provides linear operation over temperature corners, process corners, supply voltage corners, and the like.

In this regard in one aspect, a power amplifier stage is disclosed. The power amplifier stage comprises an input. The power amplifier stage also comprises an output. The power amplifier stage also comprises at least one amplifying device. The power amplifier stage also comprises a bias circuit. The power amplifier stage also comprises a common-mode feedback loop coupled to the output and the bias circuit. The common-mode feedback loop comprises a voltage sensor configured to sense a common-mode voltage at the output, wherein respective bias signals are based on the sensed common-mode voltage. The power amplifier stage also comprises at least one asymmetric dynamic feedback circuit coupled from the output of the power amplifier stage to at least one bias terminal of the power amplifier stage.

In another aspect, a power amplifier stage is disclosed. The power amplifier stage comprises an input. The power amplifier stage also comprises an output. The power amplifier stage also comprises a common-mode supply input. The power amplifier stage also comprises a supply circuit that has insufficient bandwidth for a given radio frequency (RF) signal modulation bandwidth. The power amplifier stage also comprises a supply current sensing circuit that extracts an envelope component of a supply current. The power amplifier stage also comprises a fast feed-forward branch that bypasses the supply circuit with the insufficient bandwidth, by providing a high-frequency supply current for the power amplifier stage.

In another aspect, a power amplifier stage is disclosed. The power amplifier stage comprises an input. The power amplifier stage also comprises an output. The power amplifier stage also comprises a common-mode supply circuit with insufficient bandwidth. The power amplifier stage also comprises a bias circuit coupled to a first gate and coupled to a second gate. The bias circuit is configured to bias dynamically the first gate and the second gate with respective bias signals. The power amplifier stage also comprises a bias feedback loop coupled to the output and the bias circuit. The bias feedback loop comprises a voltage sensor configured to sense voltage at the output, wherein the respective bias signals are based on the sensed voltage. The power amplifier stage also comprises a common-mode supply feed-forward path comprising a current sensor configured to sense a high-frequency envelope current of the power amplifier stage and inject a properly-scaled current back into a power amplifier supply line to bypass the common-mode supply circuit with the insufficient bandwidth.

In another aspect, a power amplifier stage is disclosed. The power amplifier stage comprises an input. The power amplifier stage also comprises an output. The power amplifier stage also comprises a first NFET comprising a first gate. The first NFET is coupled to the input and the output. The power amplifier stage also comprises a first PFET comprising a second gate. The first PFET is coupled to the input and the output. The power amplifier stage also comprises a bias circuit coupled to the first gate and coupled to the second gate. The bias circuit is configured to bias dynamically the first gate and the second gate with respective bias signals. The power amplifier stage also comprises a feedback loop coupled to the output and the bias circuit. The feedback loop comprises a voltage sensor configured to sense voltage at the output, wherein the respective bias signals are based on the sensed voltage.

In another aspect, a power amplifier stage is disclosed. The power amplifier stage comprises an input. The power amplifier stage also comprises an output. The power amplifier stage also comprises a common-mode supply input. The power amplifier stage also comprises a first NFET comprising a first gate. The first NFET is coupled to the input and the output. The power amplifier stage also comprises a first PFET comprising a second gate. The first PFET is coupled to the input and the output and the common-mode supply input. The power amplifier stage also comprises a feedback loop comprising a current sensor configured to sense current for the first PFET and adjust a signal from the common-mode supply input based on the sensed current.

In another aspect, a power amplifier stage is disclosed. The power amplifier stage comprises an input. The power amplifier stage also comprises an output. The power amplifier stage also comprises a common-mode supply input. The power amplifier stage also comprises a first NFET comprising a first gate. The first NFET is coupled to the input and the output. The power amplifier stage also comprises a first PFET comprising a second gate. The first PFET is coupled to the input and the output. The power amplifier stage also comprises a bias circuit coupled to the first gate and coupled to the second gate. The bias circuit is configured to bias dynamically the first gate and the second gate with respective bias signals. The power amplifier stage also comprises a bias feedback loop coupled to the output and the bias circuit. The bias feedback loop comprises a voltage sensor configured to sense voltage at the output, wherein the respective bias signals are based on the sensed voltage. The power amplifier stage also comprises a common-mode supply feedback loop comprising a current sensor configured to sense current for the first PFET and adjust a signal from the common-mode supply input based on the sensed current.

DETAILED DESCRIPTION

Figure 1:
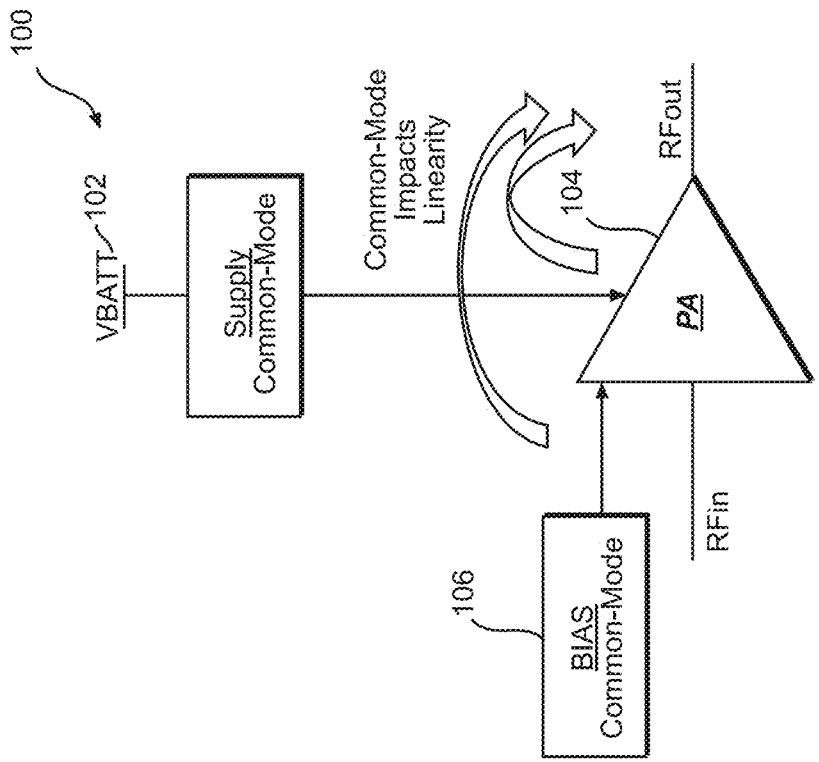
FIG. 1 is a block diagram of an exemplary power amplifier stage with a common-mode bias input and a common-mode supply input.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that tennis used herein should be interpreted as having a meaning that is consistent with their meaning in the context of this specification and the relevant art and will not be interpreted in an idealized or overly formal sense unless expressly so defined herein.

Aspects disclosed in the detailed description include a power amplifier using multi-path common-mode feedback loops for radio frequency linearization. In particular, a complementary metal oxide semiconductor (CMOS) power amplifier containing cascoded n-type field effect transistors (FETs) (NFETs) and cascoded p-type FETs (PFETs) may have a common-mode feedback network and provides bias voltages that are dynamically varying with the signal power to keep the output common-mode fixed around a half-supply level, while the small-signal and large-signal transconductances of the FETs are kept balanced. A further feedback network may be associated with the supply voltage to assist in providing a symmetrical supply signal. The symmetrical supply signal allows for supply variations without introducing distortion for the power amplifier stage. This arrangement provides linear operation over temperature corners, process corners, supply voltage corners, and the like.

Before addressing exemplary aspects of the present disclosure, an explanation of the challenges facing a power amplifier operating across a wide range of frequencies is provided. In the past, a power amplifier might use a hybrid approach, where the power amplifier proper might be implemented in bipolar technologies using a material such as Gallium Arsenide (GaAs). The power amplifier might be controlled by a CMOS stage that has a driver amplifier, biasing circuitry, and the like. While effective at providing an acceptable cost-performance compromise while allowing tunability through, for example, a matching network and/or load line, such systems are complex and have a relatively long design cycle. Moving to a power amplifier that implements both the power amplifier as well as the control circuit in CMOS technology generally relies on nanometer CMOS processes. Such devices, and particularly the FETs of such devices, can tolerate maximum voltages much lower than typical battery voltage levels. Accordingly, such devices may rely on cascade structures, where FETs are stacked relative to one another.

Existing techniques to set a common-mode output voltage level for CMOS power amplifiers involve using a direct bias of the output node from a voltage generator or using a resistor feedback that also sets the common-mode output voltage level. However, such techniques do not offer any way to control the linearity of the stage. Specifically, the FETs in a CMOS device may have a transconductance which varies from small signal to large signal. Keeping a good linearity of the power amplifier stage requires having the NFETs and PFETs maintain balanced transconductances both at small signal and large signal levels. This balance is not readily accessible without having a dedicated circuit for such task. When the common-mode supply moves down, it reduces headroom available for the NFET, while when the common-mode supply moves up, it reduces headroom available for the PFET. Both actions result in distortions at large signal levels. If the transconductance is matched for large signals, there will be different transconductances at the small signal level, resulting in distortions at moderate signal levels. This distortion negatively impacts performance.

FIG. 1 illustrates a block diagram of a power amplifier stage 100 that has two common-mode inputs, which impact linearity. Specifically, there is a voltage source 102, e.g., VBATT, which is a common-mode supply for a power amplifier 104. The power amplifier 104 also receives a common-mode bias signal from a bias circuit 106. Further, the power amplifier 104 receives an RF input signal (RFin) and provides an RF output signal (RFout). Maintaining linearity while using these two common-mode inputs provides opportunities for improvement.

Exemplary aspects of the present disclosure provide two complimentary ways which singly or together help provide linearity for the power amplifier stage. In particular, exemplary aspects of a first of the complimentary ways of the present disclosure provide bias voltages that are dynamically varying with the signal power to keep the output common-mode fixed around a half-supply level, while the small-signal and large-signal transconductances of the FETs are kept balanced. This arrangement provides linear operation over temperature corners, process corners, supply voltage corners, and the like.

Figure 2:
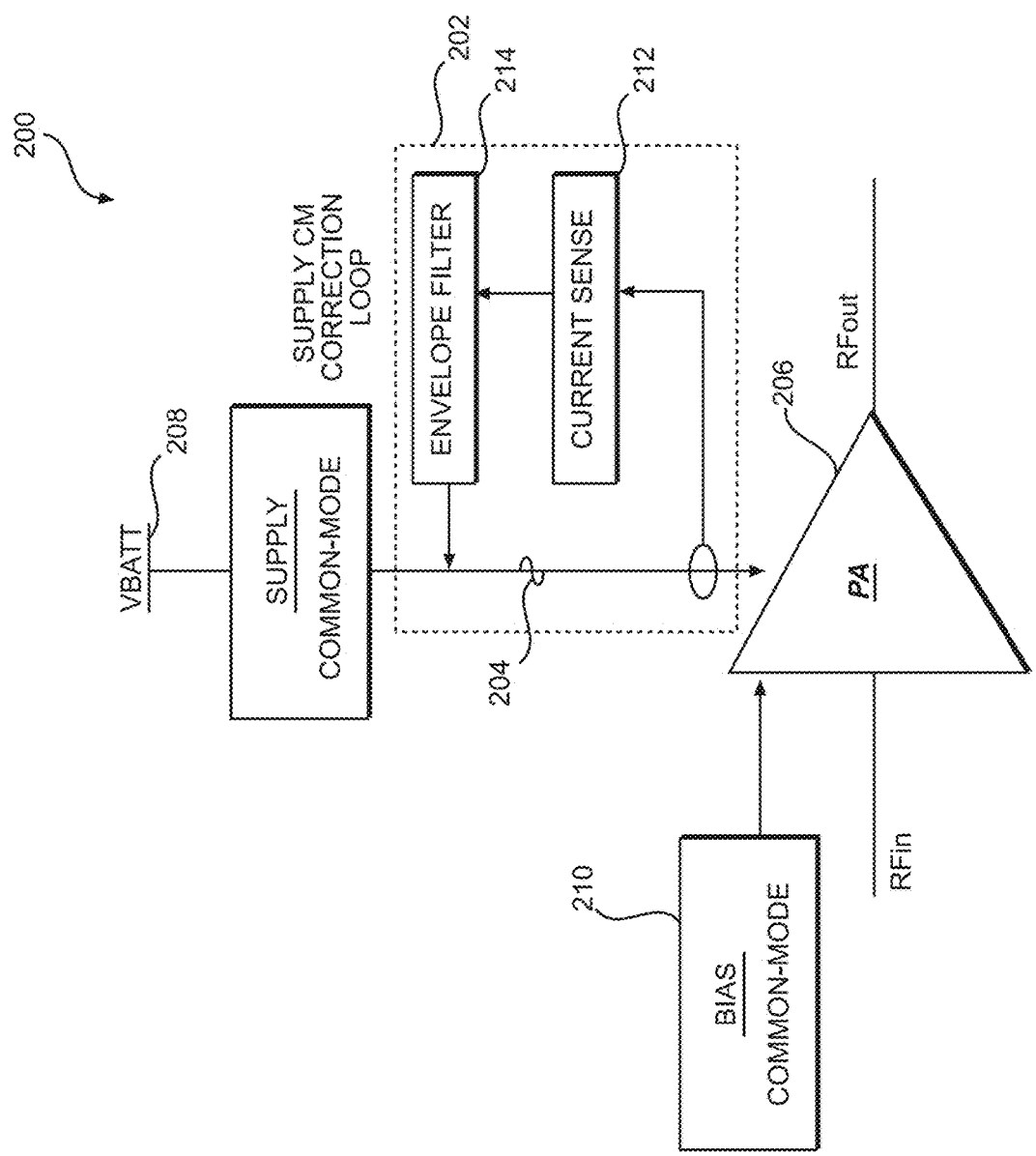
FIG. 2 is a block diagram of an exemplary power amplifier stage having a common-mode supply feedback loop to assist in providing linearity for the power amplifier stage.

In this regard, FIG. 2 illustrates a power amplifier stage 200 that has a common-mode supply correction or feedback loop 202 that modifies a supply voltage signal 204 provided to a power amplifier 206 from a voltage supply 208 (e.g., VBATT). A common-mode bias circuit 210 is not modified in the power amplifier stage 200 and is substantially similar to the bias circuit 106 of FIG. 1. The common-mode supply feedback loop 202 includes a current sensing circuit 212 and an envelope filter circuit 214. More details are provided below with reference to FIGS. 15-18. It should be appreciated that the current sensing is done indirectly as indicated by the loop feeding into the current sensing circuit 212.

Figure 3:
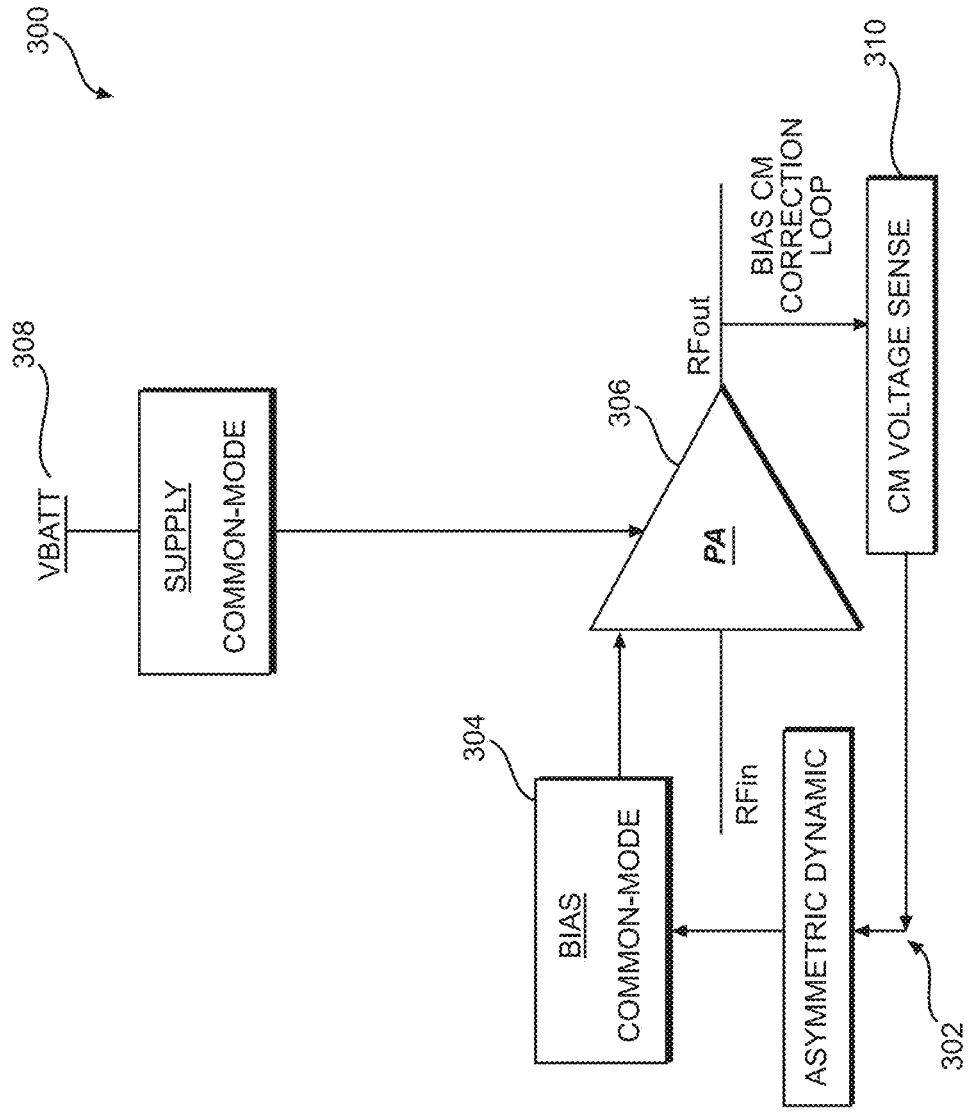
FIG. 3 is a block diagram of an exemplary power amplifier stage having a common-mode bias feedback loop to assist in providing linearity for the power amplifier stage.

In contrast, FIG. 3 illustrates a power amplifier stage 300 that has a common-mode bias correction or feedback loop 302 that modifies a common-mode bias signal from a bias circuit 304 to a power amplifier 306. The power amplifier 306 receives a common-mode supply voltage signal from a voltage supply 308. The common-mode bias feedback loop 302 includes a common-mode voltage sensor 310 that measures the common-mode voltage of the output port RFout. The common-mode bias feedback loop 302 also includes an asymmetric dynamic signal to help balance the transconductances.

Figure 4:
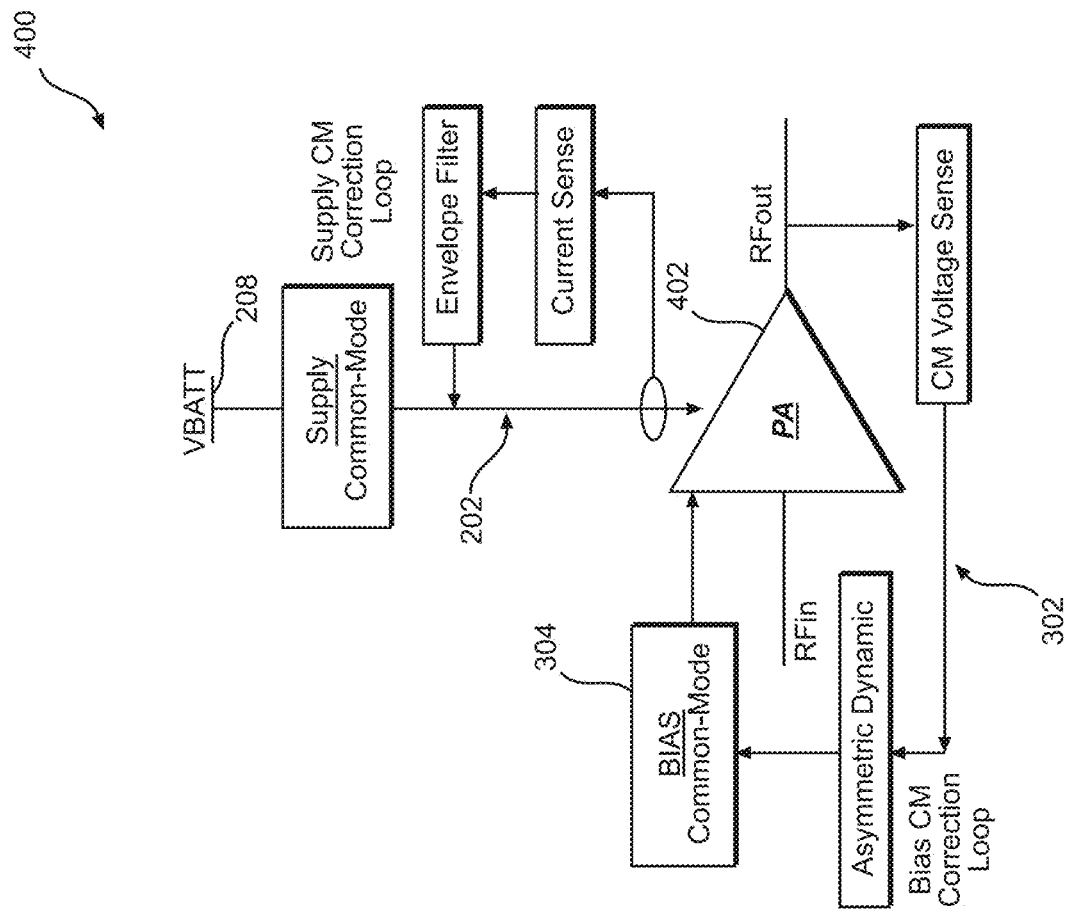
FIG. 4 is a block diagram of an exemplary power amplifier stage having two feedback loops, one for the common-mode supply and one for the common-mode bias circuit to assist in providing linearity for the power amplifier stage.

While the feedback loops 202, 302 may exist in isolation, it is also possible to use both together for greater effect. Thus, a power amplifier stage 400 illustrated in FIG. 4 includes both the common-mode supply feedback loop 202 and the common-mode bias feedback loop 302 with a power amplifier 402.

Figure 5A:
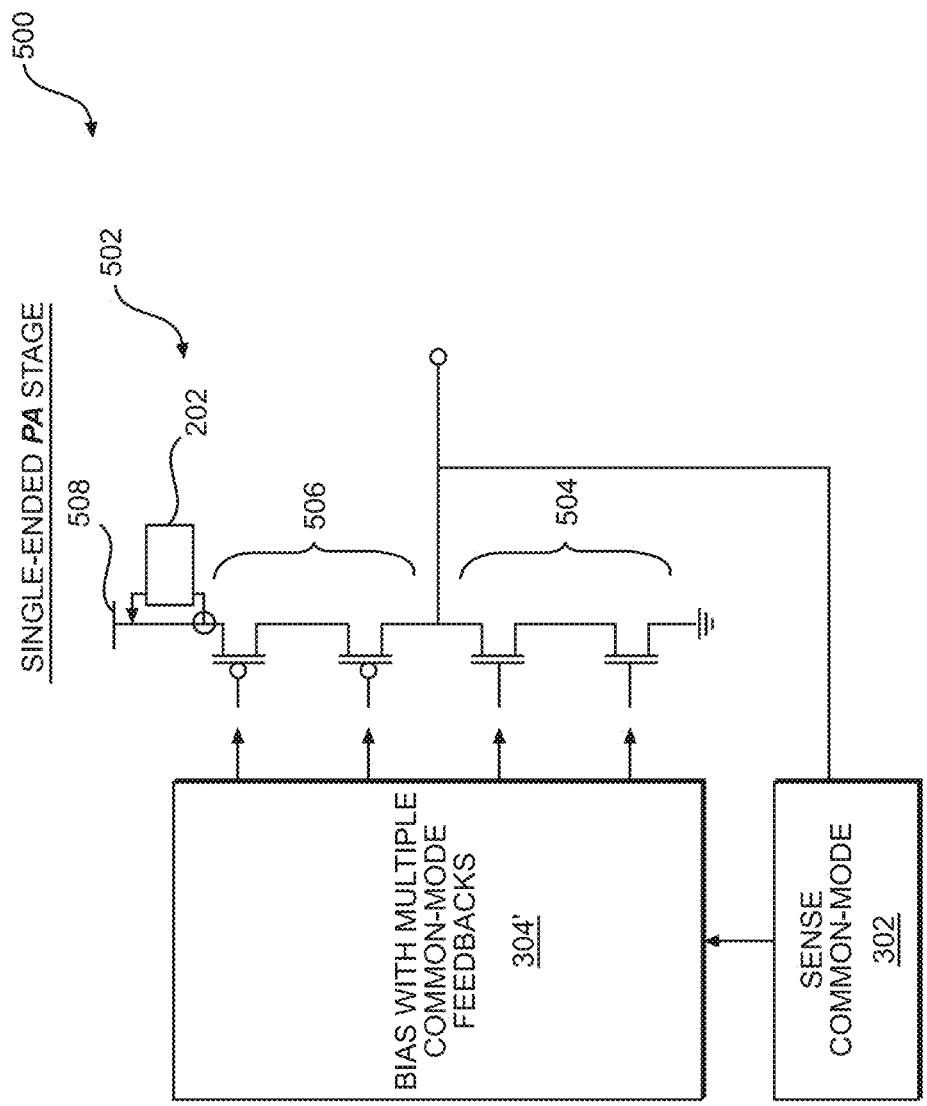
FIGS. 5A and 5B illustrate single-ended and differential-ended power amplifier structures that may implement the feedback loops of the present disclosure to assist in linearization.

Before addressing details of the present disclosure, it should be appreciated that the concepts of the present disclosure have wide application. While most of the examples provided below focus on single-ended power amplifier stages, the present disclosure is not so limited. Thus, while FIG. 5A illustrates explicitly a single-ended power amplifier stage 500, FIG. 5B illustrates a differential power amplifier stage 550, and it should be appreciated that the concepts of the present disclosure may be extended to quadrature power amplifier stages (not shown) and Doherty, barely Doherty, out-phasing, and the like (also not shown) without departing from the present disclosure.

Returning to FIG. 5A, the single-ended power amplifier stage 500 includes a CMOS power amplifier 502 having NFETs 504 and PFETs 506. The common-mode supply feedback loop 202 is provided above the PFETs 506 (i.e., between VBATT 508 and a PFET 506). Likewise, the common-mode bias feedback loop 302 works with bias circuit 304' to provide multiple bias signals to the NFETs 504 and the PFET's 506. Again, it should be appreciated that the current sensing of the common-mode supply feedback loop 202 is indirect.

Figure 5B:
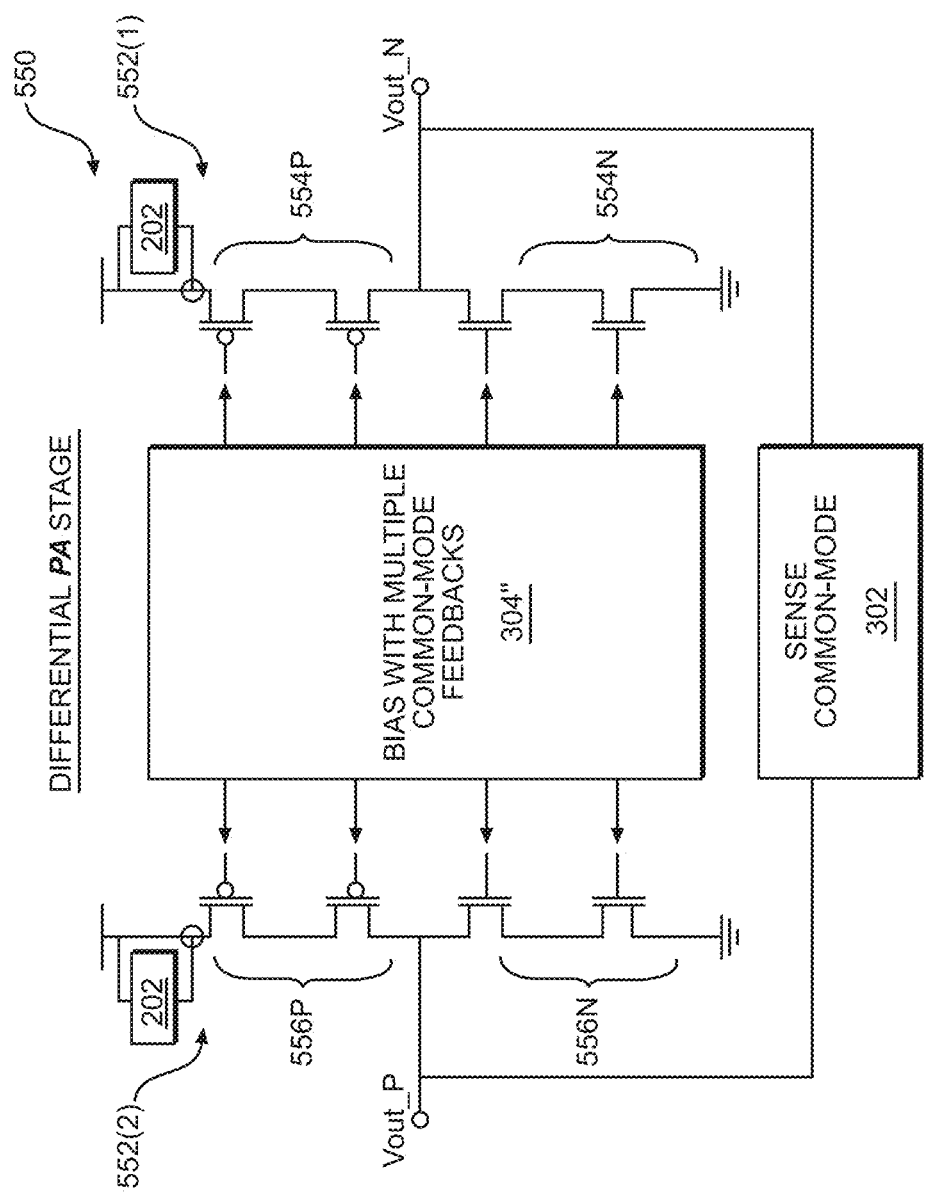
Figure 6:
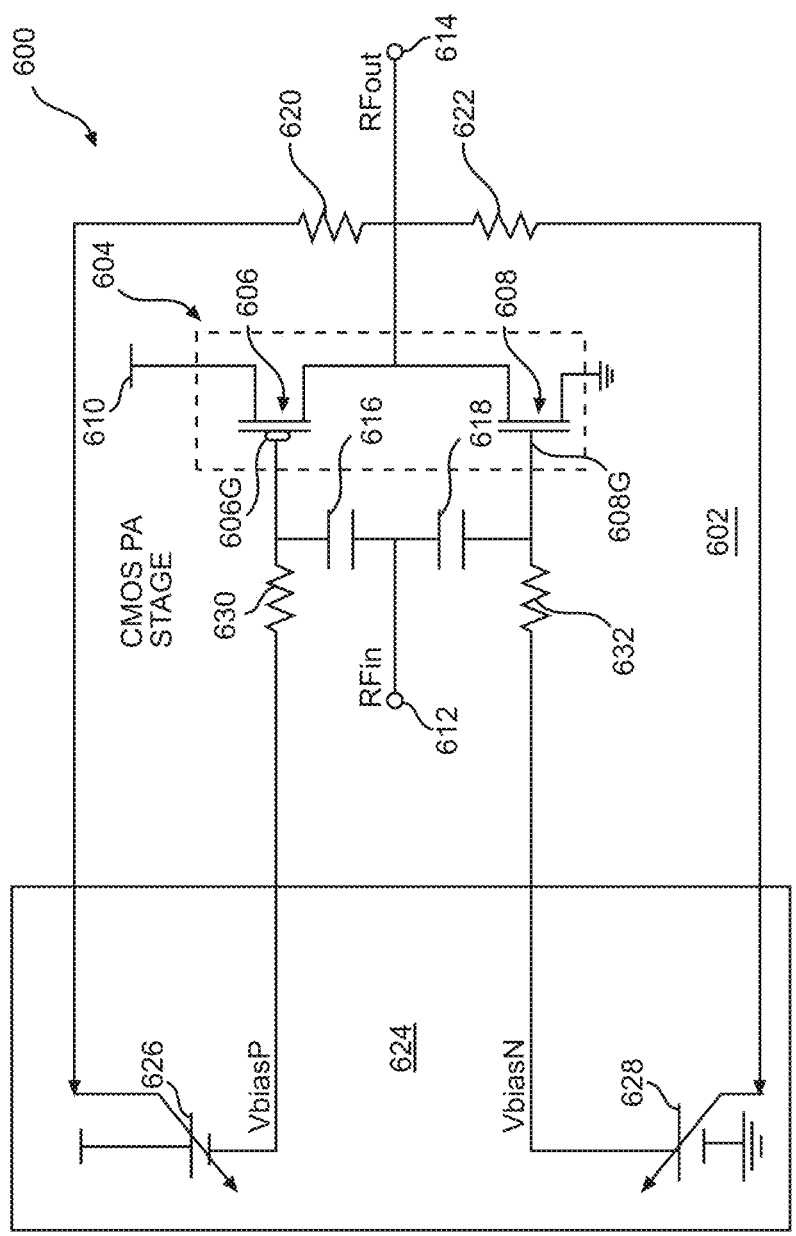
FIG. 6 is a circuit diagram showing further details of the common-mode bias feedback loop for a non-cascoded complementary metal oxide semiconductor (CMOS) power amplifier stage.
Figure 7:
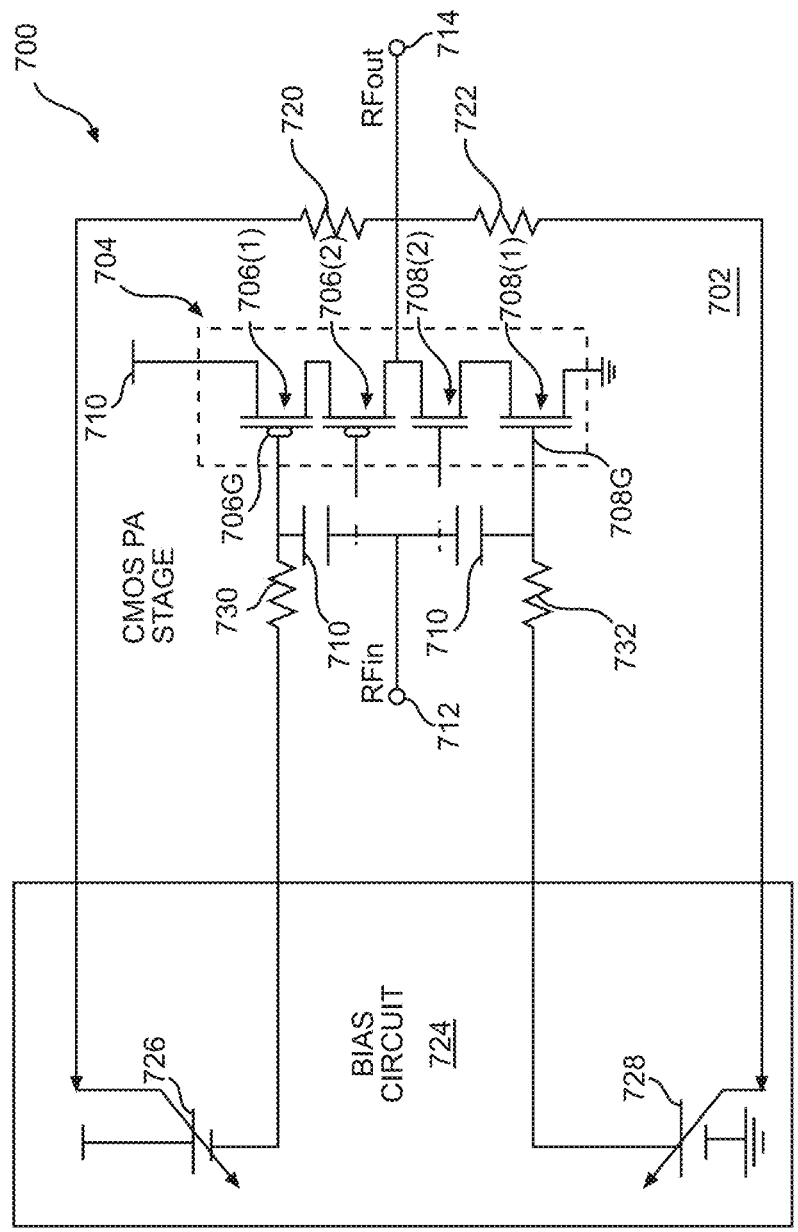
FIG. 7 is a circuit diagram showing further details of the common-mode bias feedback loop for a cascoded CMOS power amplifier stage.
Figure 8:
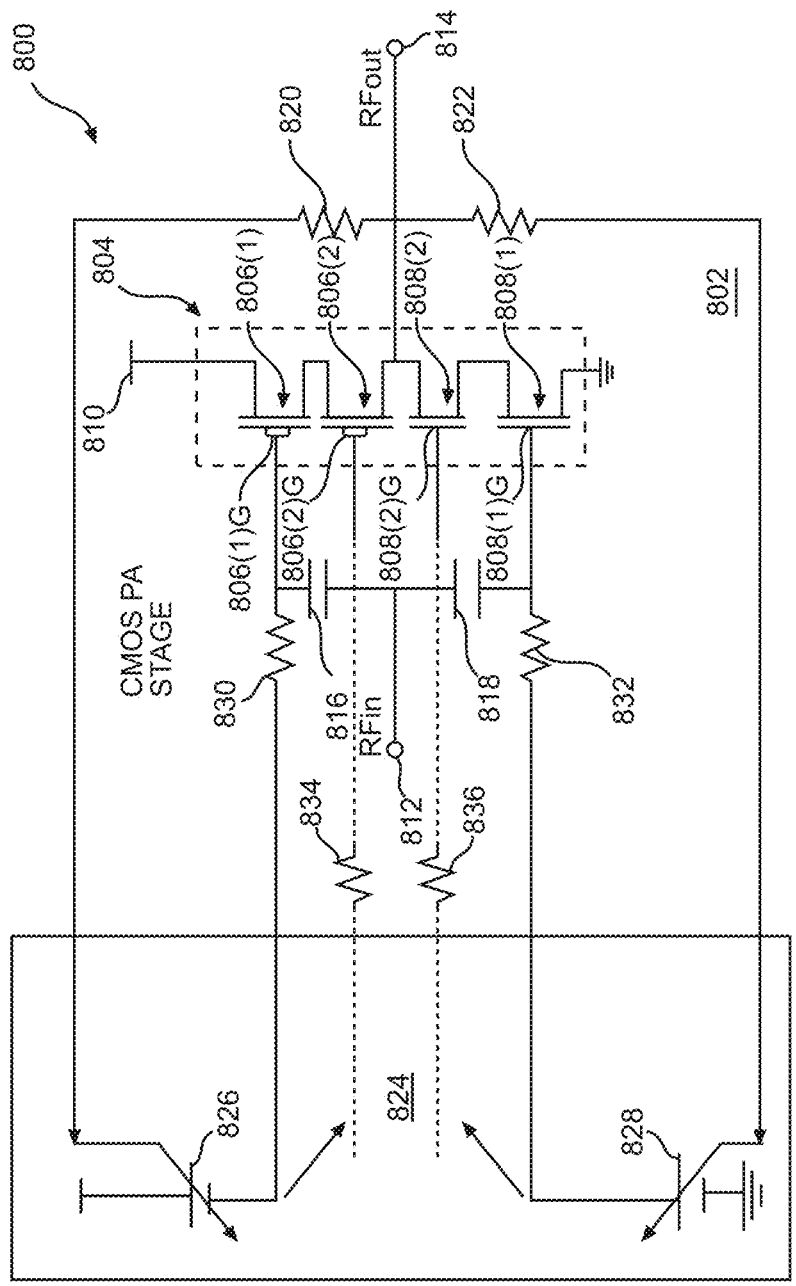
FIG. 8 is a circuit diagram showing further details of the common-mode bias feedback loop for a cascoded CMOS power amplifier stage where bias for the cascoded amplifiers is also dynamically adjusted by the feedback loop.

In FIG. 5B, the differential power amplifier stage 550 includes two CMOS power amplifier stacks 552(1), 552(1) having NFETs 554N, 556N and PFETs 554P, 556P. The common-mode supply feedback loop 202 is provided above the PFETs 554P and 556P. The common-mode bias feedback loop 302 works with a bias circuit 304" to provide multiple bias signals to the NFETs 554N, 556N and PFETs 554P, 556P. Again, it should be appreciated that the current sensing of the common-mode supply feedback loop 202 is indirect.

A discussion of the common-mode bias feedback loop 302 is provided with reference to FIGS. 6-9. In particular, the common-mode bias feedback loop 302 may be implemented in a simple CMOS power amplifier stage 600 as loop 602. The power amplifier stage 600 may include a FET stack 604 including a PFET 606 and an NFET 608. The FET stack 604 may couple to a supply 610 and receive an input signal (RFin) from an input node 612 while providing an output signal (RFout) at an output node 614. The input node 612 may be coupled to gates 606G, 608G of the FETs 606, 608 through capacitors 616, 618, respectively. The output node 614 may be coupled to resistors 620, 622, which couple to a bias circuit 624. The bias circuit 624 may include a first variable source 626 and a second variable source 628 that are controlled based on the signal from the output node 614. The variable sources 626, 628 provide bias signals to the gates 606G, 608G, respectively, through respective resistors 630, 632. By dynamically adjusting the bias signals provided to the gates 606G, 608G, the common-mode voltage at the output node 614 may be kept at about half the supply voltage from the supply 610.

While effective, the CMOS power amplifier stage 600 is limited in that the total swing is limited by the single NFET 608 and single PFET 606. More commonly, a CMOS power amplifier stage will have cascoded FETs as shown in power amplifier stage 700 illustrated in FIG. 7. The power amplifier stage 700 includes a loop 702, analogous to the loop 602 of FIG. 6, but accommodating a cascoded FET stack 704. The cascoded FET stack 704 includes PFETs 706(1), 706(2) and NFETs 708(1), 708(2). The FET stack 704 may couple to a supply 710 and receive an input signal (RFin) from an input node 712 while providing an output signal (RFout) at an output node 714. The input node 712 may be coupled to gates 706G, 708G of the FETs 706(1), 708(1) through capacitors 716, 718, respectively. The output node 714 may be coupled to resistors 720, 722, which couple to a bias circuit 724. The bias circuit 724 may include a first variable source 726 and a second variable source 728 that are controlled based on the signal from the output node 714. The variable sources 726, 728 provide bias signals to the gates 706G, 708G, respectively, through respective resistors 730, 732. By dynamically adjusting the bias signals provided to the gates 706G, 708G, the signal at the output node 714 may be kept at about half the supply voltage from the supply 710.

Controlling the bias of the FETs 706(1), 708(1) may be insufficient to hold the output node at about half the supply. Accordingly, it may be appropriate also to bias the cascoded devices in the amplifier stack as illustrated by power amplifier stage 800 in FIG. 8. The power amplifier stage 800 includes a loop 802, analogous to the loop 602 of FIG. 6, but accommodating a cascoded FET stack 804. The cascoded FET stack 804 includes PFETs 806(1), 806(2) and NFETs 808(1), 808(2). The FET stack 804 may couple to a supply 810 and receive an input signal (RFin) from an input node 812 while providing an output signal (RFout) at an output node 814. The input node 812 may be coupled to gates 806(1)G, 808(1)G of the FETs 806(1), 808(1) through capacitors 816, 818, respectively. The output node 814 may be coupled to resistors 820, 822, which couple to a bias circuit 824. The bias circuit 824 may include a first variable source 826 and a second variable source 828 that are controlled based on the signal from the output node 814. The variable sources 826, 828 provide bias signals to the gates 806(1)G, 808(1)G, respectively, through respective resistors 830, 832. Additional bias signals may be provided from the variable sources 826, 828 to gates 806(2)G, 808(2)G through resistors 834, 836. By dynamically adjusting the bias signals provided to the gates, the signal at the output node 814 may be kept at about half the supply voltage from the supply 810. Note that while only one cascoded FET is shown on each half of the stack 804, the concept may be extended to larger cascoded stacks without departing from the present disclosure.

Sometimes it may not even be sufficient to bias the cascoded devices in the amplifier stack. Accordingly, an additional measure may be to control the drains of the cascoded devices as illustrated by power amplifier stage 900 in FIG. 9A. The power amplifier stage 900 includes loop 902, analogous to the loop 602 of FIG. 6, but accommodating a cascoded FET stack 904. The cascoded FET stack 904 includes PFETs 906(1), 906(2) and NFETs 908(1), 908(2). The FET stack 904 may couple to a supply 910 and receive an input signal (RFin) from an input node 912 while providing an output signal (RFout) at an output node 914. The input node 912 may be coupled to gates 906(1)G, 908(1)G of the FETs 906(1), 908(1) through capacitors 916, 918, respectively. The output node 914 may be coupled to resistors 920, 922, which couple to a bias circuit 924. The bias circuit 924 may include a first variable source 926 and a second variable source 928 that are controlled based on the signal from the output node 914. The variable sources 926, 928 provide bias signals to the gates 906(1)G, 908(1)G, respectively, through respective resistors 930, 932. Additional bias signals may be provided from the variable sources 926, 928 to gates 906(2)G, 908(2)G through resistors 934, 936. Further, capacitors 938, 940 may be used to couple drains 906(2)D, 908(2)D to varactors 942, 944, respectively. By dynamically adjusting the bias signals provided to the gates, the signal at the output node 914 may be kept at about half the supply voltage from the supply 910. Further, the use of the varactors 942, 944 may be used to hold the drains at desired levels to assist in keeping the output node 914 at about half the supply voltage from the supply 910.

Figure 9A:
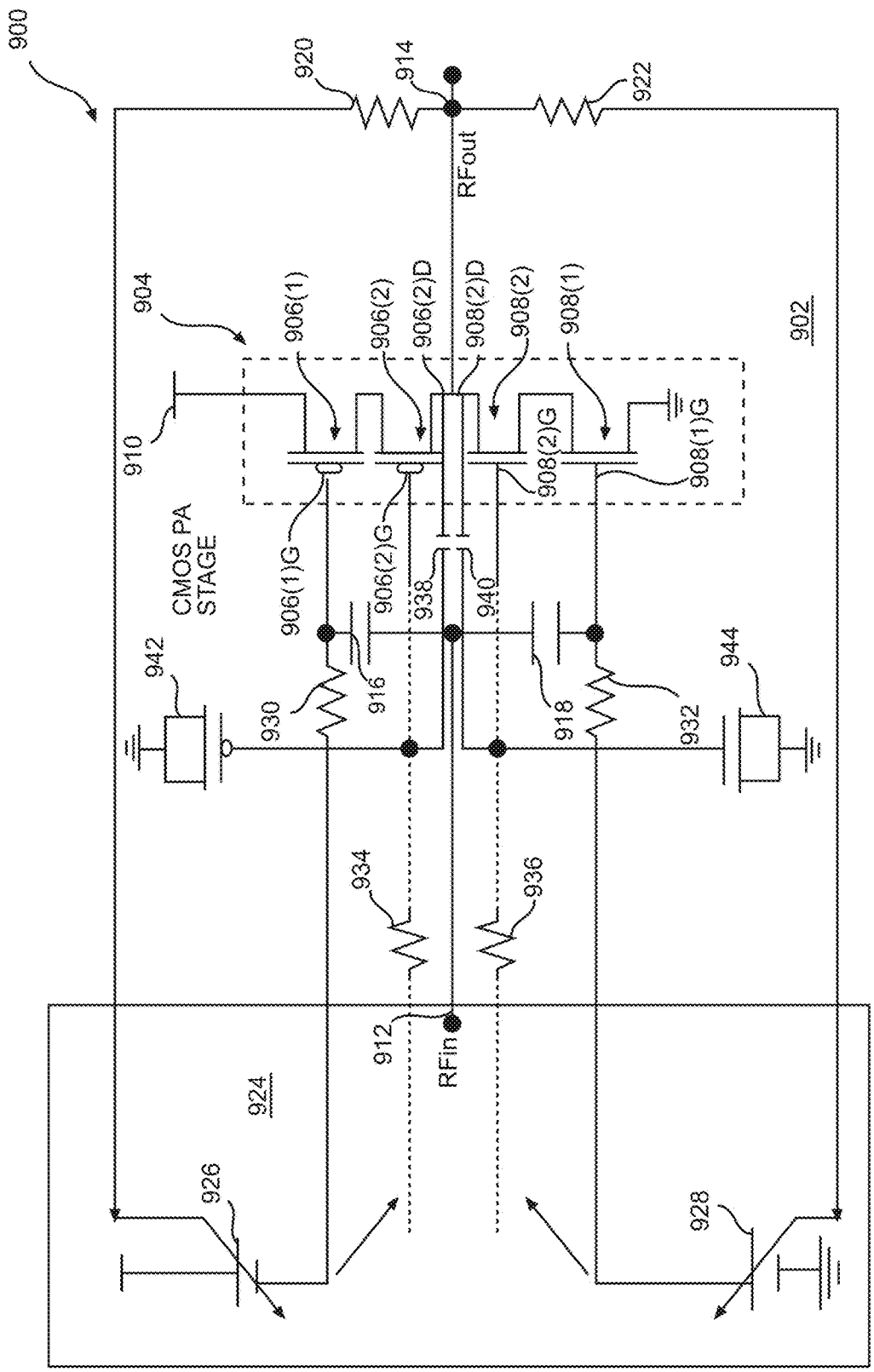
FIG. 9A is a circuit diagram showing further details of the common-mode bias feedback loop for the cascoded CMOS power amplifier stage of FIG. 8 with additional compensation for drains of the cascoded amplifiers.
Figure 9B:
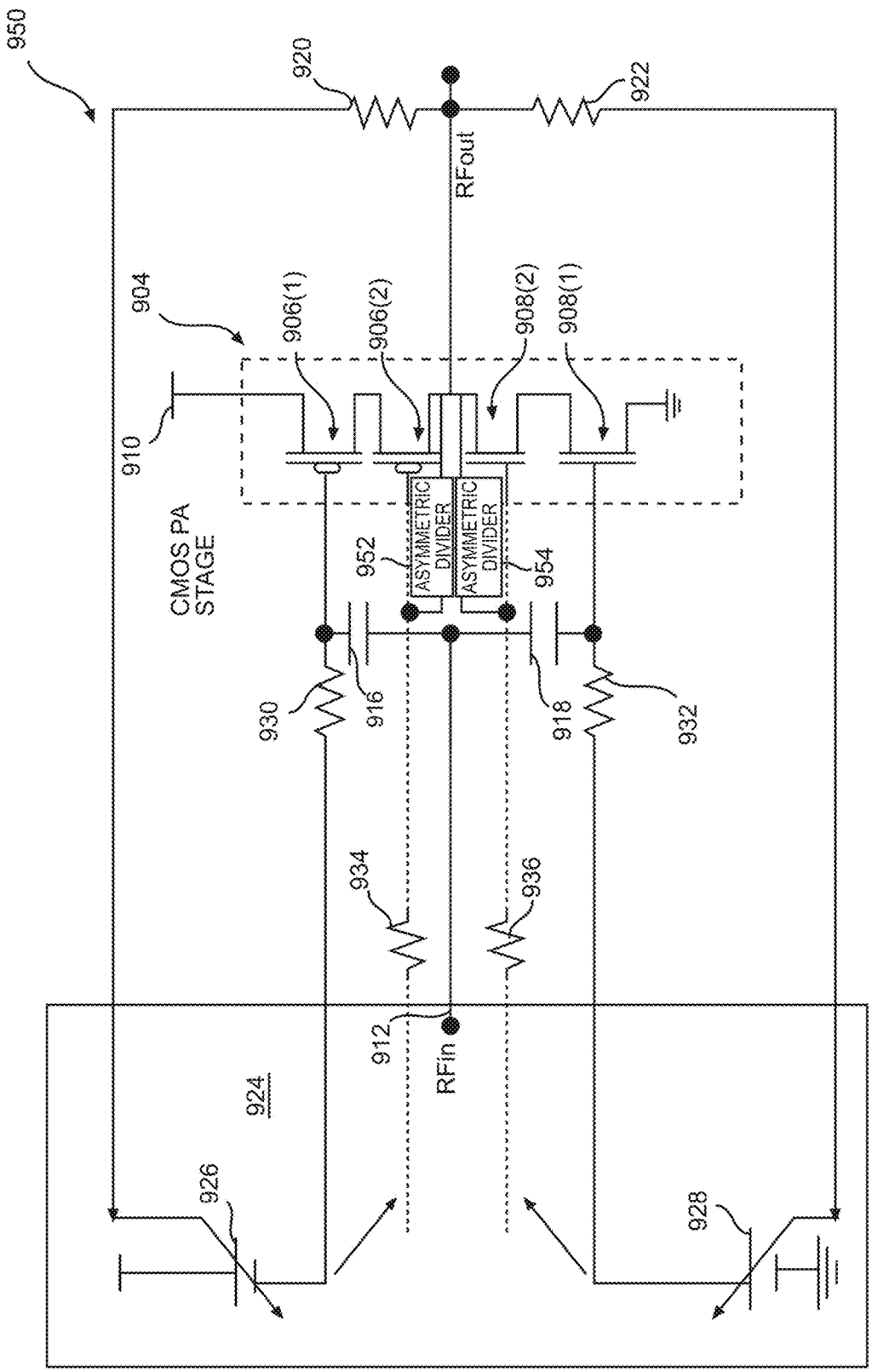
FIG. 9B is a circuit diagram similar to the CMOS power amplifier stage of FIG. 9A, but with generic asymmetric voltage dividers for the dynamic common-mode biasing.

FIG. 9B shows a power amplifier stage 950, which is substantially similar to the power amplifier stage 900, and common elements maintain common numbering. However, in place of the capacitors 938, 940 and varactors 942, 944 a more generalized asymmetric output voltage divider circuit 952, 954 may be provided.

Figure 10:
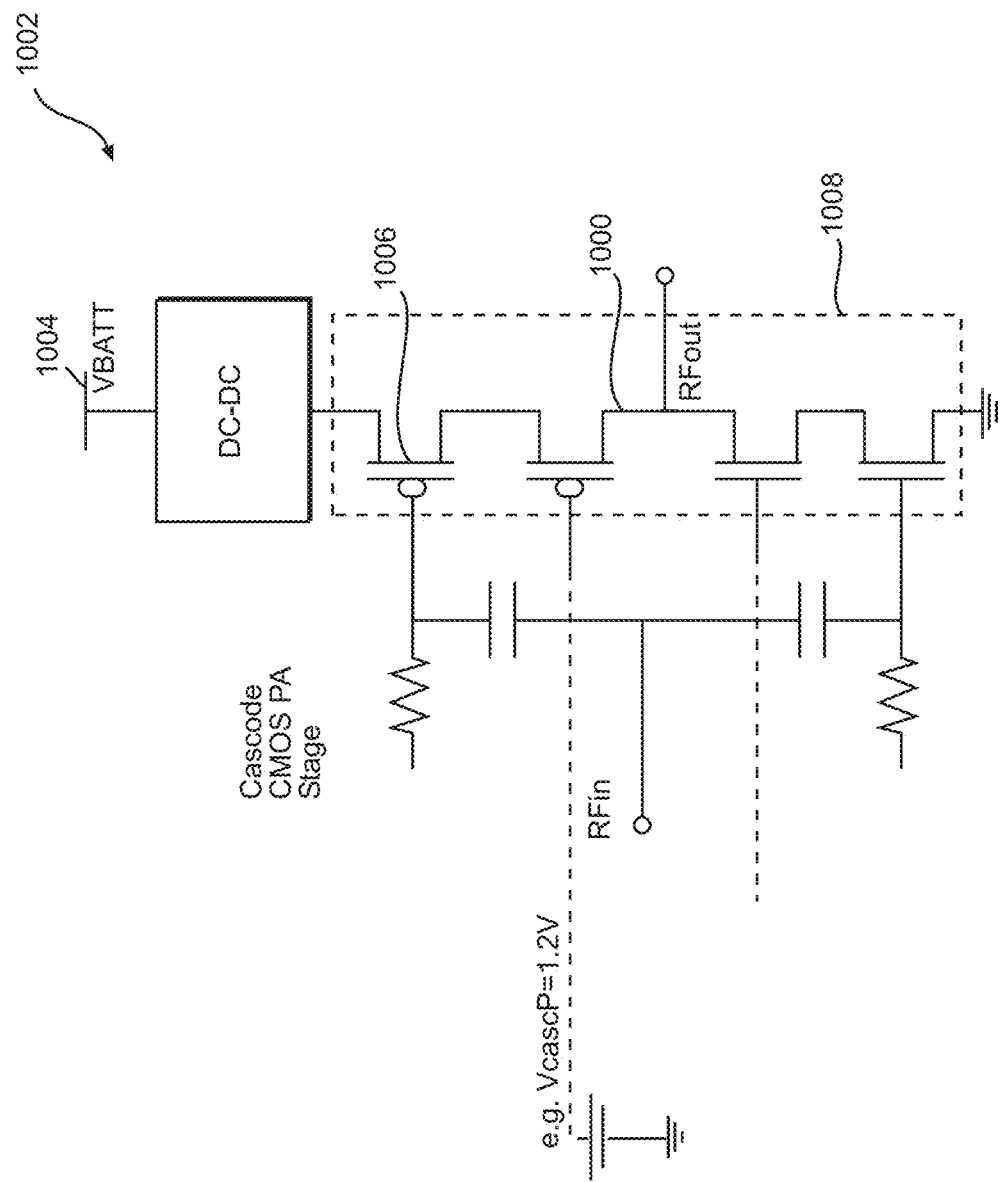
FIG. 10 is a circuit diagram of a CMOS power amplifier stage that may have a common-mode bias feedback loop, but also suffers performance problems when a voltage supply dips below a threshold, crushing a cascoded amplifier.

There may be occasions when the nature of the cascode stack works against linear operation of the power amplifier stage. For example, if a cascoded PFET 1000 in a power amplifier stage 1002 illustrated in FIG. 10 is biased to some point (e.g., 1.2 volts (V)), then the supply 1004 needs to be somewhere above that point (e.g., +0.3 V) to keep the PFET 1006 turned on. Thus, if the supply 1004 dips below a certain threshold (e.g., in this case 1.5 V), the PFET portion of the FET stack 1008 will collapse and turn off. Turning off the PFET portion of the FET stack 1008 negatively impacts the ability of the power amplifier stage 1002 to operate linearly.

Figure 11:
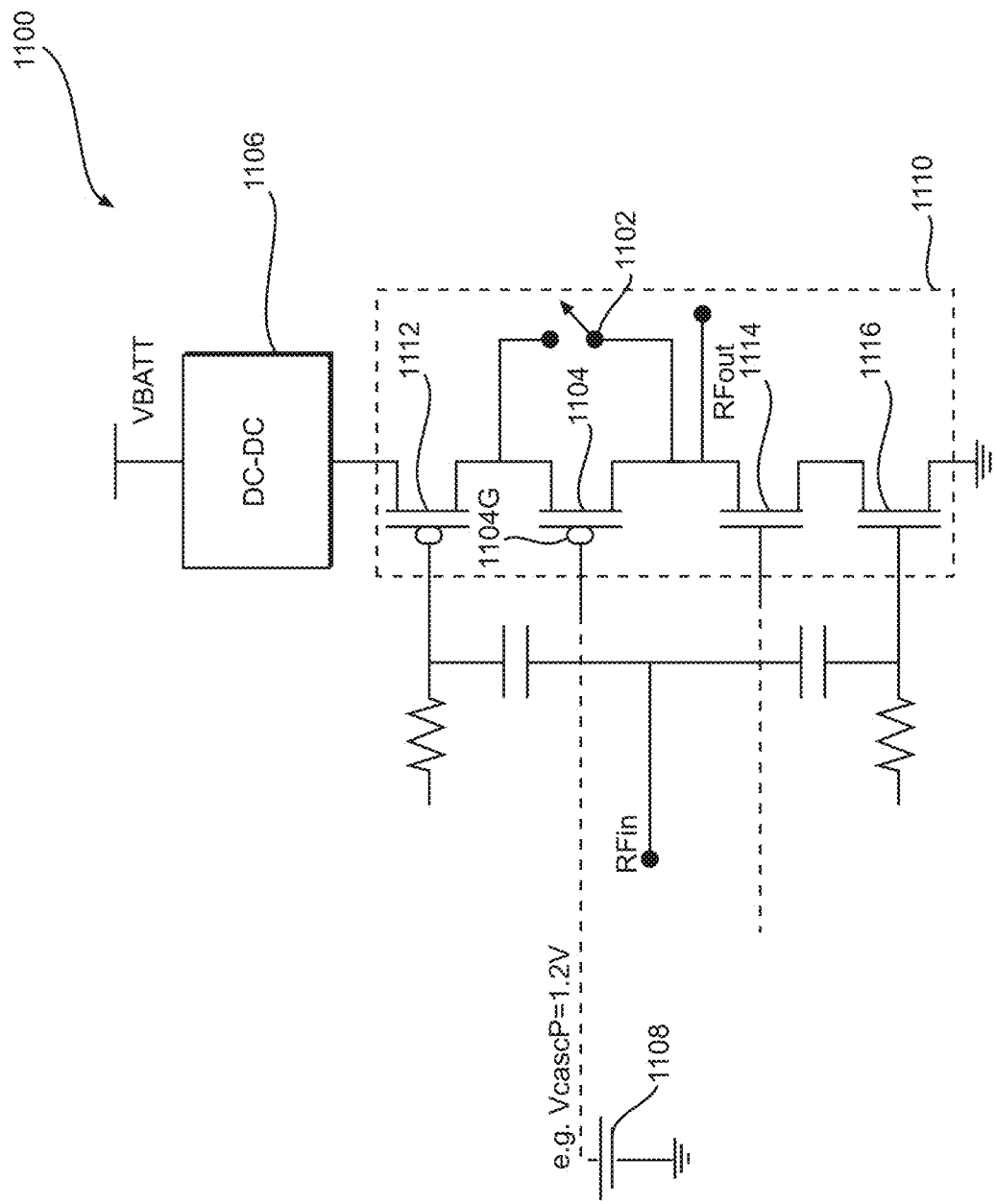
FIG. 11 is a circuit diagram of a CMOS power amplifier stage that may have a common-mode bias feedback loop with a bypass switch to prevent crushing the cascoded amplifier.

Exemplary aspects of the present disclosure provide a solution to prevent collapse of the PFET portion of a power amplifier stage 1100 as shown in FIG. 11. Specifically, a bypass switch 1102 is placed around a cascode PFET 1104. When the supply 1106 drops below a predetermined threshold corresponding approximately to the bias source 1108 of the cascode PFET 1104, the bypass switch 1102 may be turned on forming a short across the cascode PFET 1104, which removes the cascode PFET 1104 from a FET stack 1110. PFET 1112 and NFETs 1114, 1116 remain active in the FET stack 1110, promoting linear operation.

In an alternate aspect (not illustrated), when the supply voltage is low, the PFET 1104 is turned into an ON switch (equivalent with a short). To do so, the gate terminal 1104G of the PFET 1104 is biased such that the PFET 1104 operates in a triode region and acts like a short. In some cases, such dynamic bias voltage needed to turn the PFET 1104 into an ON switch may need to go negative (i.e., below a ground potential). Generating a negative bias for this situation may require additional complexity such as providing, for example, a charge pump.

Figure 13:
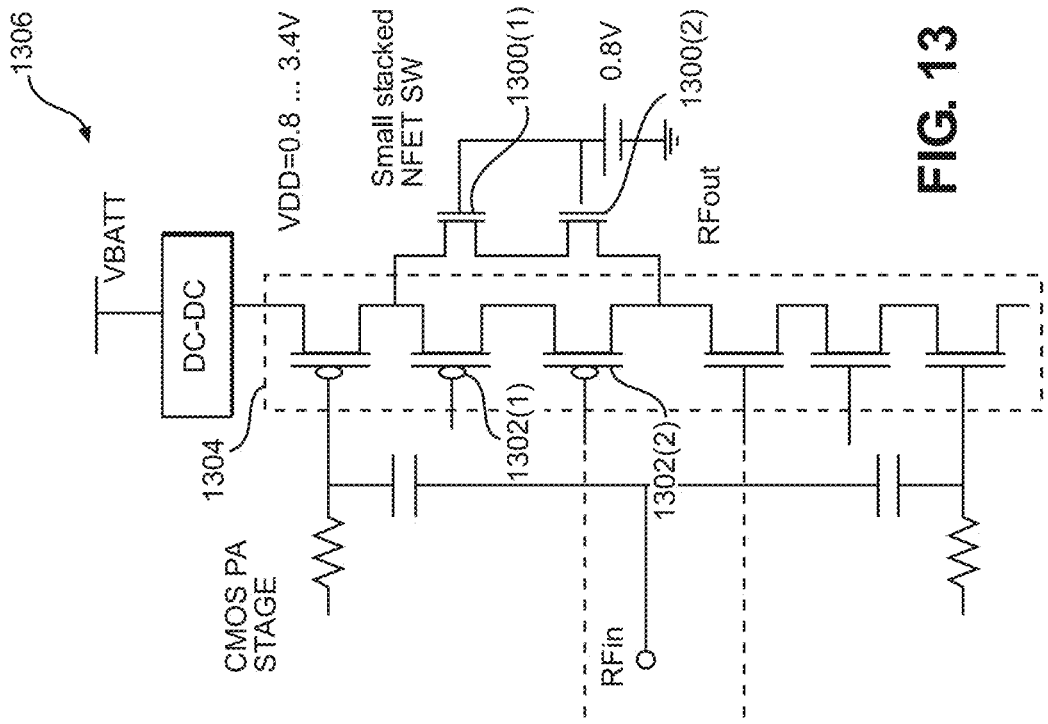
FIG. 13 is a circuit diagram showing how the bypass switch of FIG. 12 may be expanded to a larger cascode stack.
Figure 12:
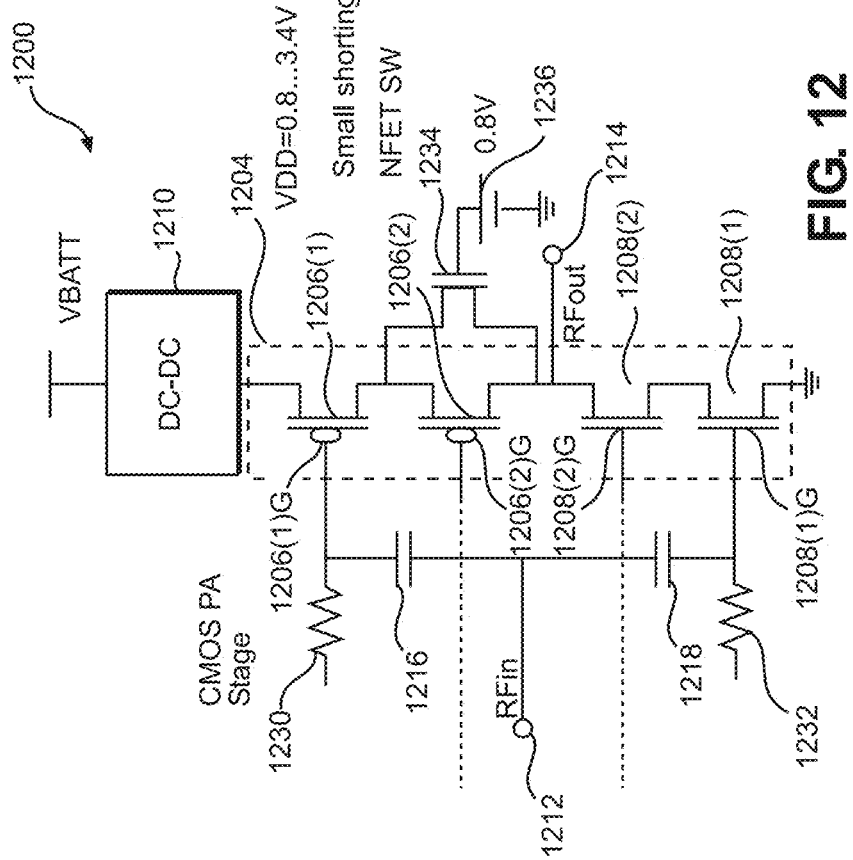
FIG. 12 is a circuit diagram showing one possible implementation of the bypass switch of FIG. 11.
Figure 15:
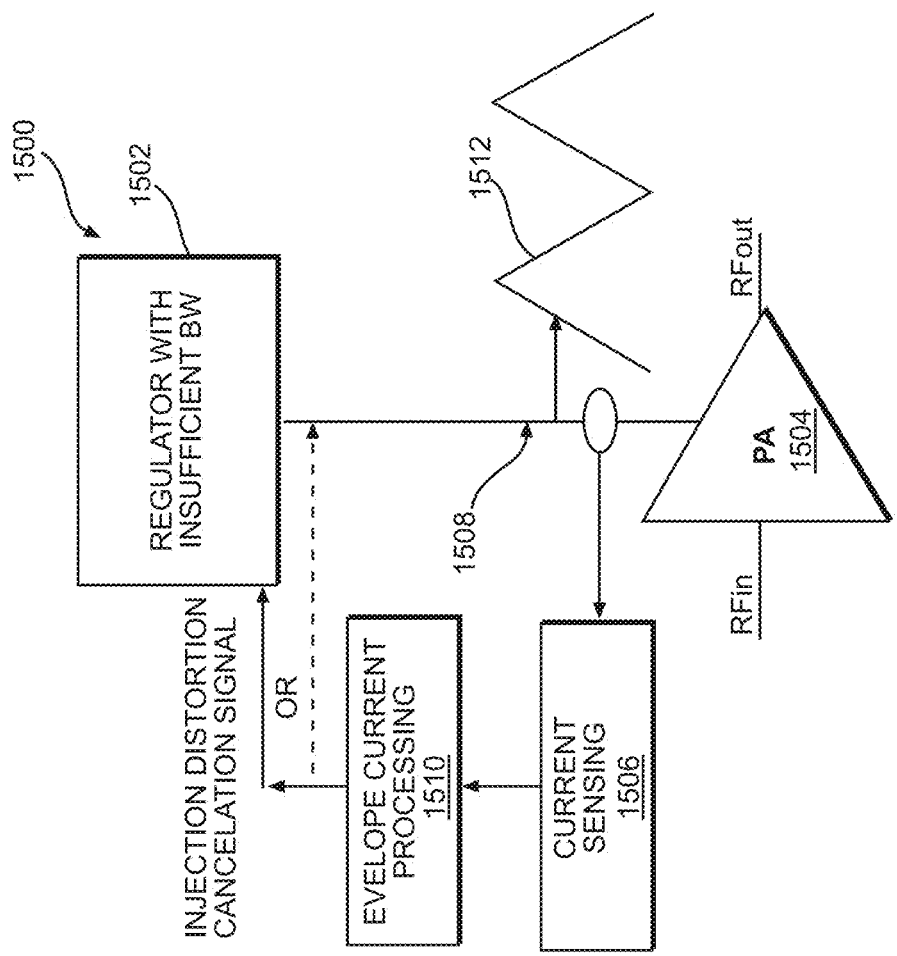
FIG. 15 is a block diagram of a power amplifier stage with a common-mode supply feedback loop that senses current from the voltage supply and modulates the supply signal to provide a symmetric supply waveform.

FIGS. 12 and 13 show possible implementations of the bypass switch 1102. Specifically, in FIG. 12, a power amplifier stage 1200 includes a cascoded FET stack 1204. The cascoded FET stack 1204 includes PFETs 1206(1), 1206(2) and NFETs 1208(1), 1208(2). The FET stack 1204 may couple to a supply 1210 and receive an input signal (RFin) from an input node 1212 while providing an output signal (RFout) at an output node 1214. The input node 1212 may be coupled to gates 1206(1)G, 1208(1)G of the FETs 1206(1), 1208(1) through capacitors 1216, 1218, respectively. Bias signals may be provided from a bias circuit (not shown) to the gates 1206(1)G, 1208(1)G through respective resistors 1230, 1232. Additional bias signals may be provided from the bias circuit to gates 1206(2)G, 1208(2)G. A bypass switch may be implemented as an NFET 1234 coupled to a source 1236. When the supply 1210 drops below the value of the source 1236, the NFET 1234 shorts and the PFET 1206(2) is bypassed. Otherwise, the NFET 1234 is open and the PFET 1206(2) remains as a cascoded FET for the FET stack 1204.

This concept of removing the cascoded PFETs may be extended to larger cascode stacks as illustrated in FIG. 13, where multiple NFETs 1300(1)-1300(2) may be used to bypass cascode PFETs 1302(1)-1302(2) in a FET stack 1304 of a power amplifier stage 1306. The stack of NFETs 1300(1)-1300(2) may be useful in withstanding large signals levels when the switch is in an OFF state (at larger supply voltage values)

Figure 14:
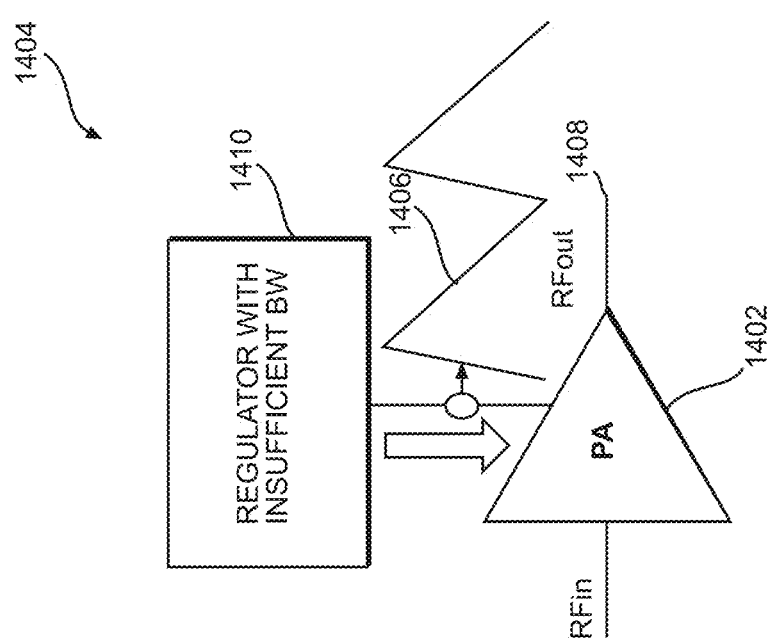
FIG. 14 is a block diagram of a power amplifier stage having a voltage supply that lacks sufficient bandwidth for the signals being amplified by the power amplifier stage.

As noted above, there is another common-source input for many amplifier stages, and that is a common-mode supply source. Normally, such supplies need to have a bandwidth larger than a modulation bandwidth supported by the power amplifier stage. For lower modulation bandwidths of the RF signal (e.g., 200 kHz, 4 MHz, etc.), this constraint can be supported with supply circuits having existing techniques. The bandwidth of the supply circuits may need to be three to six (3-6) times larger than the RF signal modulation bandwidth, which may go up to around 24 MHz. Existing techniques support such bandwidths. However, the advent of 5G-NR with its operational ranges in the gigahertz has correspondingly increased the modulation bandwidth to increase the supported data rates. Routinely, the 5G signals can have modulated bandwidths from several tens of megahertz up through several hundreds of megahertz. For example, if the RF signal modulation bandwidth is 100 MHz, the bandwidth of the supply circuit may need to be around 500 MHz, which is difficult using existing techniques. Most supplies are formed from regulators or DC-DC converters and are likely to have insufficient bandwidth. When a regulator 1400 with an insufficient bandwidth supplies a power amplifier 1402 within a power amplifier stage 1404 as illustrated in FIG. 14, the supply may assume an asymmetric wave form 1406, which leads to distortion at an output 1408 of the power amplifier stage 1404. This distortion can be particularly troubling for complementary amplifiers that have the PFET side of the amplifier exposed to the supply voltage variation. An asymmetry in the supply signal variation will thus result in an asymmetry and distortion in the signal path.

A solution to this problem is to use the common-mode supply feedback loop 202 described above. More detail is provided by power amplifier stage 1500 with reference to FIG. 15. Specifically, a supply 1502, which may be a regulator or a DC-DC converter, may have insufficient bandwidth in its provision of a common-mode supply to a power amplifier stack 1504, when compared with a generalized multiplier (e.g., 3 to 6) of the RF signal modulation bandwidth. A current sensor 1506 may be associated with the supply line 1508. The sensed current may be conditioned through a processing circuit 1510, which may be, for example, an envelope processing circuit. The output of the processing circuit 1510 may be injected into the supply 1502 or onto the supply line 1508 to form a fast feed forward path. This feedback allows the asymmetries in the supply to be reduced or eliminated such that a small amplitude symmetric supply waveform 1512 is provided to the power amplifier stack 1504.

Figure 16:
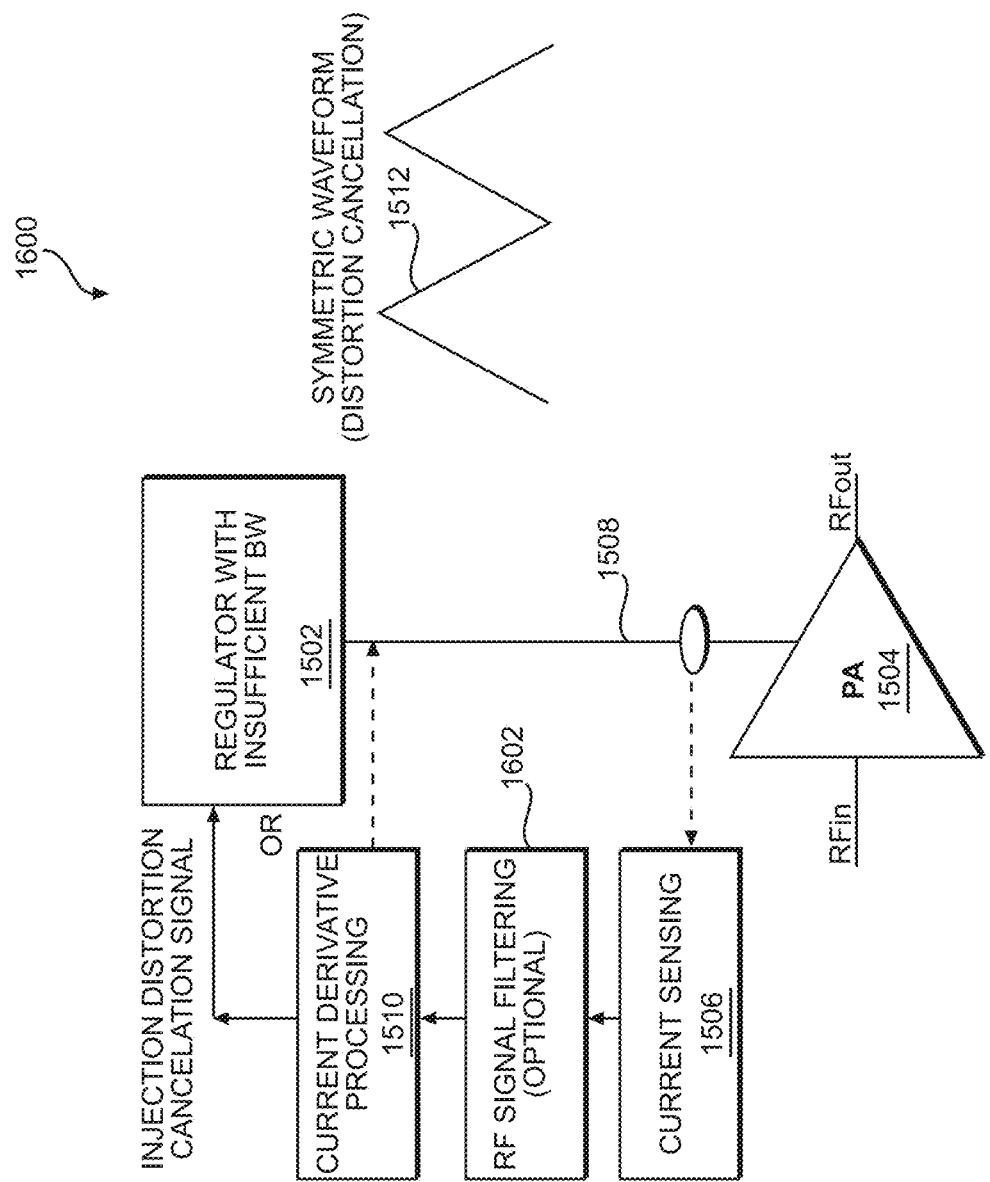
FIG. 16 is a block diagram of a power amplifier stage similar to that of FIG. 15, but with optional signal filtering.

As an additional improvement shown by power amplifier stage 1600 in FIG. 16, a filter 1602 may be added to the feedback loop. In all other respects, the power amplifier stage 1600 is essentially identical to the power amplifier stage 1500 of FIG. 15.

The power amplifier stage 1600 allows for a relatively low bandwidth supply circuit (e.g., regulator) to provide the lower frequency component of the power amplifier supply current, while the higher frequency component of the supply current is provided by the fast feed-forward loop. As such, the limited bandwidth of the supply circuit does not result in distortions in the power amplifier.

Figure 17:
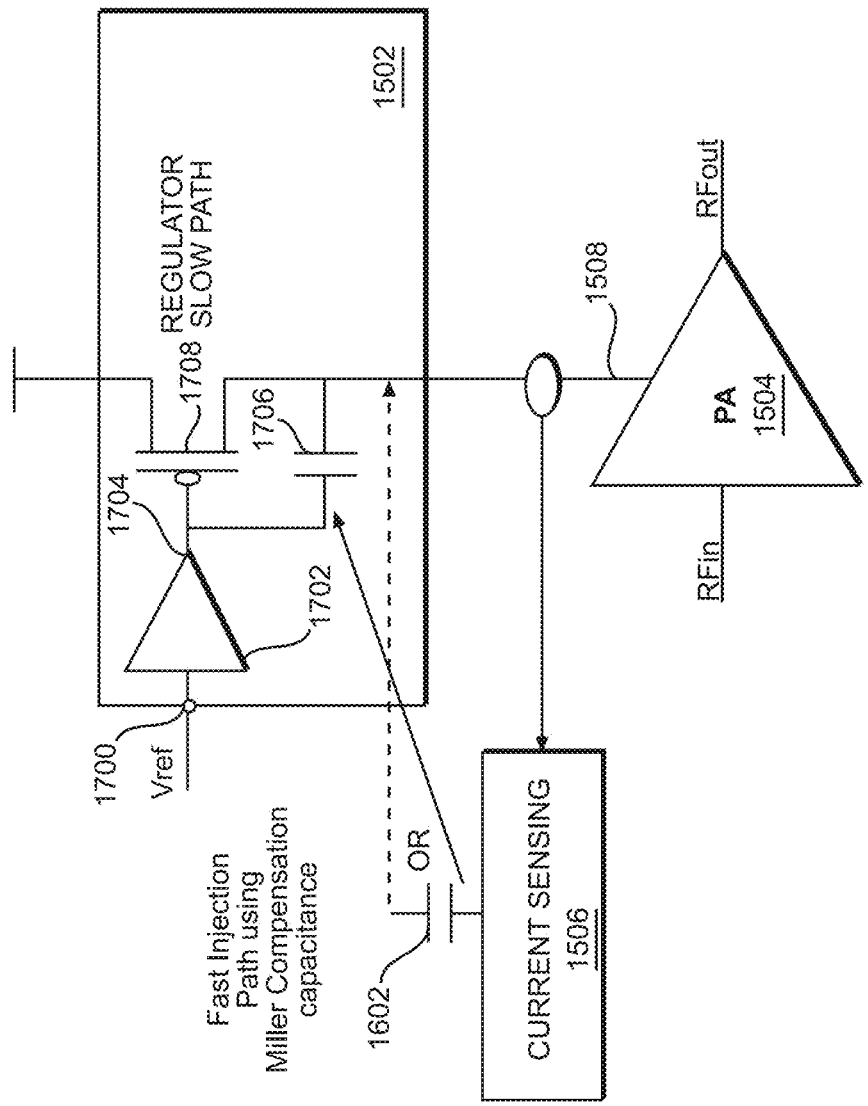
FIG. 17 is a mixed block and circuit diagram showing details of how the feedback signal of FIGS. 15 and 16 may be used to modulate the supply signal.

More details for the injection process are shown in FIG. 17, where the supply 1502 may include an input node 1700 that receives a reference voltage (Vref). The reference voltage may be amplified by an amplifier 1702. An output 1704 from the amplifier 1702 is provided to a capacitor 1706 and a PFET 1708. The filter 1602 may be a capacitor, and the processing circuit 1510 may be omitted. Current from the current sensor 1506 may be provided to the capacitor 1706 of the supply line 1508.

Figure 18:
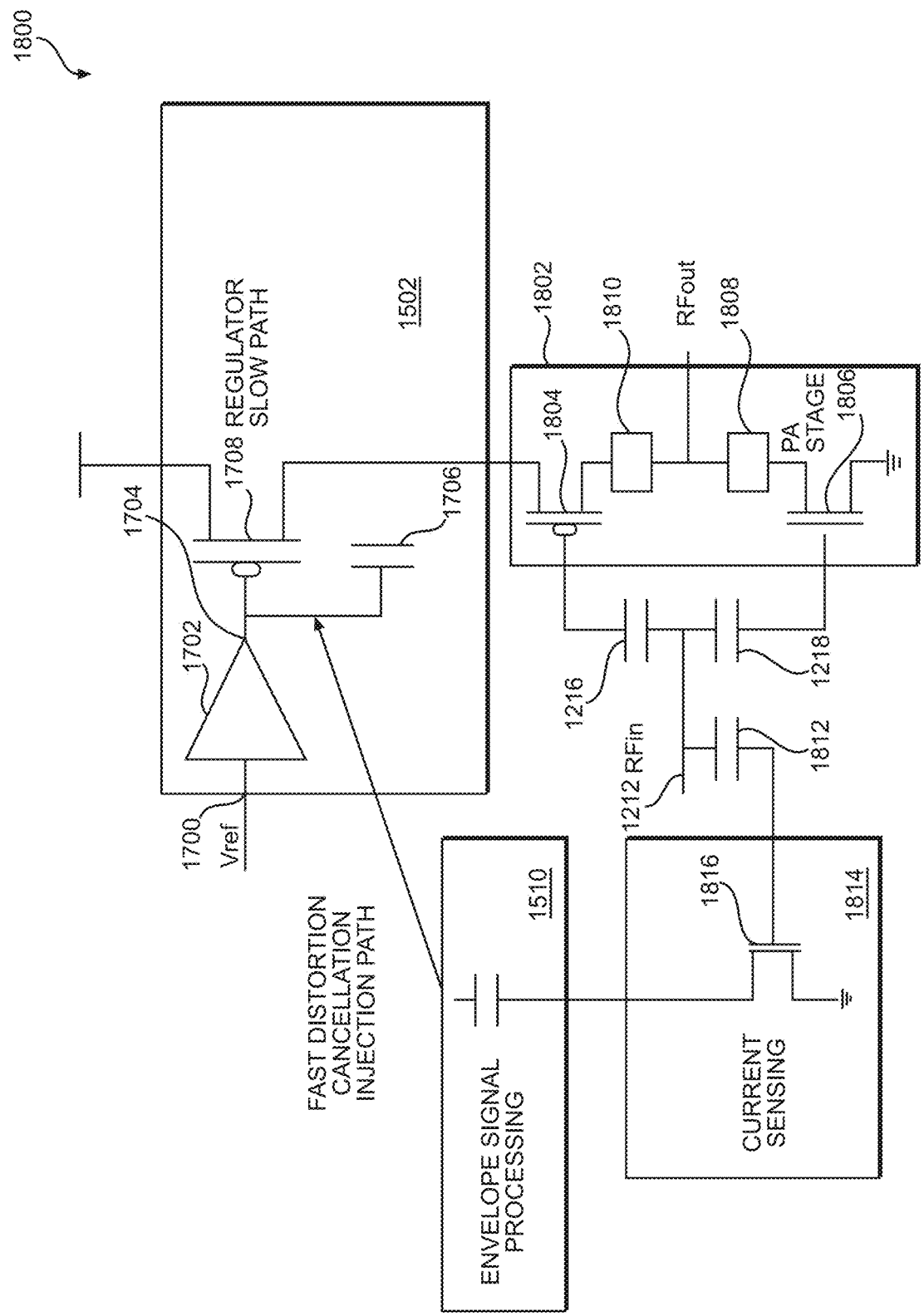
FIG. 18 is a circuit diagram showing an alternate way to sense current to assist in forming the common-mode supply feedback loop.

Instead of sensing current directly on the supply line 1508, current may be sensed indirectly as shown by power amplifier stage 1800 in FIG. 18. The power amplifier stage 1800 may include a FET stack 1802 that is coupled to the supply 1502. The FET stack 1802 may include a PFET 1804 and an NFET 1806 and optional cascode FETs 1808, 1810.

The input node 1212 may be coupled to a capacitor 1812 and current sensor 1814, which may be an NFET, which effectively acts like a current mirror that mirrors the current in the NFET 1806 with NFET 1816.

The high frequency current component of the feed-forward path may be injected directly at the power amplifier supply line, for example, using an AC coupling capacitance that isolates the DC level from the power amplifier supply and the DC level from the feed-forward path.

In an alternate aspect, the high frequency current component of the feed-forward path may be injected at the power amplifier supply line using a capacitor already present in the circuit, such as the compensation capacitance of the supply circuit. One such example is a PFET 1708 output regulator 1502 that has a Miller compensation capacitance 1706 connected from the gate to the drain of the regulator output PFET device as shown in FIG. 18.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. A power amplifier stage comprising:
   an input;
   an output;
   a first n-type field effect transistor (FET) (NFET) comprising a first gate, the first NFET coupled to the input through a first capacitor at the first gate and coupled to the output;
   a first p-type FET (PFET) comprising a second gate, the first PFET coupled to the input through a second capacitor at the second gate and coupled to the output, the first PFET being in parallel with the first NFET;
   a bias circuit coupled to the first gate and coupled to the second gate, the bias circuit configured to bias dynamically the first gate and the second gate with respective bias signals; and
   a feedback loop coupled to the output and the bias circuit, the feedback loop comprising a voltage sensor configured to sense a common-mode voltage at the output, wherein the respective bias signals are based on the sensed output common-mode voltage to keep an output common-mode fixed around a half-supply level, while small signal and large signal transconductances of the first NFET and the first PFET are kept balanced.

2. The power amplifier stage of claim 1, wherein the bias circuit comprises at least one variable voltage source configured to provide a variable bias voltage as at least one of the respective bias signals.

3. The power amplifier stage of claim 1, further comprising:
   a second NFET cascoded relative to the first NFET; and
   a second PFET cascoded relative to the first PFET.

4. The power amplifier stage of claim 3, wherein the second NFET comprises a third gate and the second PFET comprises a fourth gate; and
   wherein the bias circuit is coupled to the third gate and the fourth gate.

5. The power amplifier stage of claim 1, further comprising a first varactor and a second varactor coupled in parallel to the output.

6. The power amplifier stage of claim 3, further comprising a bypass switch configured to bypass the second PFET.

7. The power amplifier stage of claim 6, wherein the bypass switch comprises a third NFET, and wherein the third NFET is configured to short circuit the second PFET when a voltage supply drops below a threshold.

8. The power amplifier stage of claim 1, further comprising:
   a common-mode supply input; and
   a common-mode supply feedback loop comprising a current sensor configured to sense current for the first PFET and adjust a signal from the common-mode supply input based on the sensed current.

9. The power amplifier stage of claim 8, wherein the feedback loop is configured to shape the signal from the common-mode supply input into a symmetric signal.

10. The power amplifier stage of claim 8, further comprising a second NFET cascoded relative to the first NFET and a second PFET cascoded relative to the first PFET.

11. The power amplifier stage of claim 10, wherein the current sensor comprises a current mirror coupled to the input.

12. The power amplifier stage of claim 8, wherein the feedback loop further comprises a filter.

13. The power amplifier stage of claim 8, wherein the current sensor is coupled to a source of the first PFET and is configured to sense current directly.

14. The power amplifier stage of claim 8, wherein the current sensor is coupled to the input and configured to sense current indirectly.

15. A power amplifier stage comprising:
   an input;
   an output;
   a common-mode supply input;
   a first n-type field effect transistor (FET) (NFET) comprising a first gate, the first NFET coupled to the input and the output;
   a first p-type FET (PFET) comprising a second gate, the first PFET coupled to the input and the output;
   a bias circuit coupled to the first gate and coupled to the second gate, the bias circuit configured to bias dynamically the first gate and the second gate with respective bias signals;
   a bias feedback loop coupled to the output and the bias circuit, the bias feedback loop comprising a voltage sensor configured to sense voltage at the output, wherein the respective bias signals are based on the sensed voltage; and
   a common-mode supply feedback loop comprising a current sensor configured to sense current for the first PFET and adjust a signal from the common-mode supply input based on the sensed current.

16. The power amplifier stage of claim 15, wherein the first NFET and the first PFET form a complementary amplifier.

17. A power amplifier stage comprising:
   an input;
   an output;
   a first varactor and a second varactor coupled in parallel to the output;
   a first n-type field effect transistor (FET) (NFET) comprising a first gate, the first NFET coupled to the input and the output;
   a first p-type FET (PFET) comprising a second gate, the first PFET coupled to the input and the output;

a bias circuit coupled to the first gate and coupled to the second gate, the bias circuit configured to bias dynamically the first gate and the second gate with respective bias signals; and a feedback loop coupled to the output and the bias circuit, the feedback loop comprising a voltage sensor configured to sense voltage at the output, wherein the respective bias signals are based on the sensed voltage.

* * * * *